US010480076B2

(12) United States Patent
Choi et al.

(10) Patent No.: US 10,480,076 B2
(45) Date of Patent: Nov. 19, 2019

(54) PLASMA ENHANCED CHEMICAL VAPOR DEPOSITION APPARATUS THAT INCLUDES CONDUCTIVE MASK SUPPORTS

(71) Applicant: SAMSUNG DISPLAY CO., LTD., Yongin-si, Gyeonggi-do (KR)

(72) Inventors: Jai Hyuk Choi, Hwaseong-si (KR); Won Woong Park, Seoul (KR); Sung Hun Key, Seoul (KR); Min Soo Kim, Asan-si (KR); Byeong Chun Lee, Asan-si (KR); Suk Won Jung, Seoul (KR); Hyun Woo Joo, Yongin-si (KR); Myung Soo Huh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 916 days.

(21) Appl. No.: 15/049,162

(22) Filed: Feb. 22, 2016

(65) Prior Publication Data

US 2017/0002468 A1   Jan. 5, 2017

(30) Foreign Application Priority Data

Jun. 30, 2015   (KR) .......................... 10-2015-0093150

(51) Int. Cl.
*C23C 16/04* (2006.01)
*C23C 16/50* (2006.01)
(Continued)

(52) U.S. Cl.
CPC ............ *C23C 16/50* (2013.01); *C23C 16/042* (2013.01); *H01J 37/32366* (2013.01);
(Continued)

(58) Field of Classification Search
CPC ......... C30B 25/00; C30B 25/02; C30B 25/04; C30B 25/12; C23C 16/00; C23C 16/04; C23C 16/042; C23C 16/50; H01J 37/32366; H01J 37/32715; H01J 37/32807; H01L 21/02274
USPC ................ 117/84, 88, 94–95, 200, 204, 911; 118/715, 720–722, 723 R, 723 E, 723 I, 118/728
See application file for complete search history.

(56) References Cited

U.S. PATENT DOCUMENTS

| 2007/0065597 | A1* | 3/2007 | Kaido | C23C 16/042 427/569 |
| 2011/0114601 | A1* | 5/2011 | Lubomirsky | H01J 37/3211 216/68 |
| 2014/0158046 | A1* | 6/2014 | Kim | C23C 16/042 118/505 |

FOREIGN PATENT DOCUMENTS

| KR | 10-2006-0128550 A | 12/2006 |
| KR | 10-2007-0031785 A | 3/2007 |

(Continued)

*Primary Examiner* — Kenneth A Bratland, Jr.
(74) *Attorney, Agent, or Firm* — Lewis Roca Rothgerber Christie LLP

(57) ABSTRACT

A plasma enhanced chemical vapor deposition (PECVD) apparatus including a chamber; an upper electrode in the chamber; a spray unit in the upper electrode to spray a gas introduced from outside the chamber toward a substrate inside the chamber; a susceptor on which the substrate is mountable; a plurality of mask supports in a mask frame at an edge of the susceptor, the mask supports being formed of a conductive material that provides elastic force by supporting a mask to maintain and control a level of the mask; and a power supply unit to supply power to the upper electrode.

16 Claims, 4 Drawing Sheets

(51) Int. Cl.
  *H01L 21/02* (2006.01)
  *H01J 37/32* (2006.01)
(52) U.S. Cl.
  CPC .. *H01J 37/32715* (2013.01); *H01J 37/32807* (2013.01); *H01L 21/02274* (2013.01)

(56) References Cited

FOREIGN PATENT DOCUMENTS

KR  10-2008-0056718 A  6/2008
KR  10-2015-0010521 A  1/2015

\* cited by examiner

PLASMA ENHANCED CHEMICAL VAPOR DEPOSITION APPARATUS THAT INCLUDES CONDUCTIVE MASK SUPPORTS

CROSS-REFERENCE TO RELATED APPLICATION

Korean Patent Application No. 10-2015-0093150, filed on Jun. 30, 2015, in the Korean Intellectual Property Office, and entitled: "Plasma Enhanced Chemical Vapor Deposition Apparatus," is incorporated by reference herein in its entirety.

BACKGROUND

1. Field

Embodiments relate to a plasma enhanced chemical vapor deposition (PECVD) apparatus.

2. Description of the Related Art

In PECVD equipment for thin film deposition, a reaction gas may be supplied inside a chamber, a processing pressure may be set, and power may be provided to generate plasma. In this case, a susceptor serving as a lower electrode may be electrically grounded, and a substrate on which a film is to be formed may be mounted on the susceptor. When film-forming is to be performed in one portion of the substrate, a mask may be used to cover the other portion on which film-forming should not be performed.

The above information disclosed in this Background section is only to enhance the understanding of the background of the described technology and therefore it may contain information that does not form the prior art that is already known in this country to a person of ordinary skill in the art.

SUMMARY

Embodiments are directed to a plasma enhanced chemical vapor deposition (PECVD) apparatus.

The embodiments may be realized by providing a plasma enhanced chemical vapor deposition (PECVD) apparatus including a chamber; an upper electrode in the chamber; a spray unit in the upper electrode to spray a gas introduced from outside the chamber toward a substrate inside the chamber; a susceptor on which the substrate is mountable; a plurality of mask supports in a mask frame at an edge of the susceptor, the mask supports being formed of a conductive material that provides elastic force by supporting a mask to maintain and control a level of the mask; and a power supply unit to supply power to the upper electrode.

The plurality of mask supports may be spaced apart from one another on the mask frame with interposing intervals therebetween.

Each mask support may include a body insertedly installed in the mask frame; a conductive member insertedly installed in the body, the conductive member contacting and supporting the mask; an elastic member supporting the conductive member, the elastic member having elasticity; and a fixing member under the elastic member to support the conductive member, the fixing member being fixed to the body to prevent the conductive member and the elastic member from being separated from the body.

The conductive member may be formed of a metal material.

The conductive member may be formed of aluminum or copper.

The conductive member may be formed of an inorganic material or a polymer having conductivity.

The elastic member may be formed of a metal material.

The elastic member may include a ceramic material and a conductive material coated on a surface of the ceramic material.

The elastic member may be spring shaped.

The elastic member may be sheet shaped.

The body may be fixed to the mask frame by a bolt.

The body may be formed of aluminum or copper.

The mask may be formed of a metal material.

The mask may include a ceramic material and a metal material coated on a surface of the ceramic material.

The mask may include a metal material and a ceramic material coated on a surface of the metal material.

The mask may include a metal material and a polymer material coated on a surface of the metal material.

The power supply unit may apply a voltage of −10 kV to +10 kV to the upper electrode.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
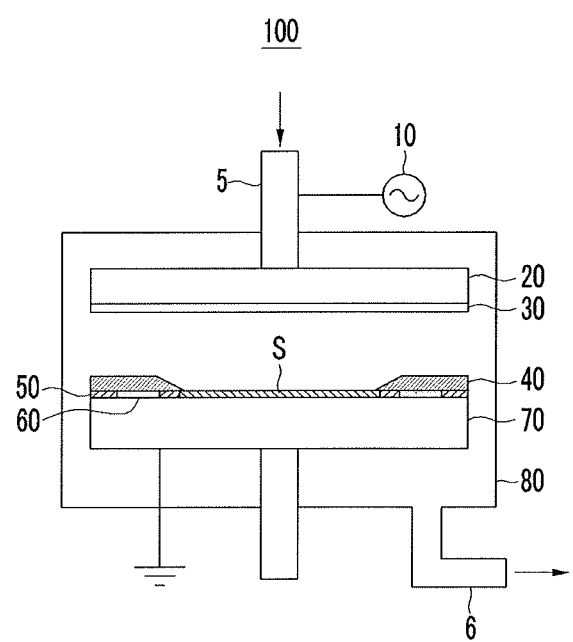
FIG. 1 illustrates a side view of a structure of a plasma enhanced chemical vapor deposition (PECVD) apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening elements may also be present. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

A plasma enhanced chemical vapor deposition (PECVD) apparatus according to an exemplary embodiment will now be described with reference to FIG. 1.

FIG. 1 schematically illustrates a structure of a PECVD apparatus according to an exemplary embodiment.

Referring to FIG. 1, the PECVD apparatus 100 may include: a chamber 80; an upper electrode 20 accommodated inside the chamber 80; a spray unit 30 installed in or on the upper electrode 20; a susceptor 70 on which a substrate S is mounted; a mask support 60 installed in a mask frame 50; and a power supply unit 10 for applying power to the upper electrode 20.

The chamber 80 may be formed as a metallic container, and a raw material gas may be introduced into the chamber 80 from the outside via a gas introducing unit 5. Inside the chamber 80 (to which the raw material gas is supplied), plasma generated by application of high frequency power activates the raw material gas and promotes a chemical reaction, and a film material formed by the chemical reaction is deposited on a top surface of the substrate S and thus forms a layer, e.g., a dielectric layer, thereon. A vacuum condition may be maintained inside the chamber 80. In an implementation, when the dielectric layer made of a silicon dioxide is formed on the substrate S, e.g., silane ($SiH_4$) and a nitrogen oxide ($N_2O$) are introduced.

The power supply unit 10 may be connected to the gas introducing unit 5, and the gas introducing unit 5 may be connected to the upper electrode 20. A raw material may be introduced into the chamber 80 via the gas introducing unit 5, and the gas introducing unit 5 may allow the upper electrode 20 to move up and down inside the chamber 80 to adjust a distance between the spray unit 30 and the substrate S.

The spray unit 30 may be installed in or on the upper electrode 20. The spray unit 30 may spray the gas introduced from the outside toward the substrate S that is placed inside the chamber 80. The spray unit 30 may be formed as a shower plate, which widely and uniformly sprays the raw material gas toward the substrate S. In an implementation, e.g., without separately including the upper electrode 20 and the spray unit 30, the spray unit 30 may also serve as the upper electrode.

The substrate S on which a film is to be formed may be mounted on the susceptor 70, and may be electrically grounded. The susceptor 70 may be operated like a lift that may move up and down, e.g., the susceptor 70 may move up and down as the substrate S is imported and exported. For example, when the substrate S is imported and exported, the susceptor 70 may move down and may be separated from the mask frame 50 that is fixed. The susceptor 70 may serve as a lower electrode, and a heater for heating the substrate S may be installed in the susceptor 70.

The mask frame 50 (for supporting the mask 40) may be provided at an upper edge region of the susceptor 70. A plurality of mask supports 60, which may be formed of a conductive material that provides elastic force by supporting the mask 40 to maintain and control its horizontal level, may be installed in the mask frame 50. The plurality of mask supports 60 may be mounted on the mask frame 50 with interposing intervals therebetween. For example, the plurality of mask supports 60 may be spaced apart from one another along the mask frame 50. In an implementation, the mask support 60 may be pressed by a weight of the mask 40 such that the mask 40 makes full surface contact with the mask frame 50.

In conjunction with the introduction of the raw material gas via the gas introducing unit 5, the raw material gas may be exhausted via the exhaust unit 6 that is disposed, e.g., under the susceptor 70.

The mask 40 may be, e.g., a metal mask that is formed of a metal material. In an implementation, the mask 40 may include a ceramic material and a metal material coated on a surface of the ceramic material. In an implementation, the mask 40 may include a metal material and a ceramic material coated on a surface of the metal material. In an implementation, the mask 40 may include a metal material and a polymer material coated on a surface of the metal material.

Figure 2:
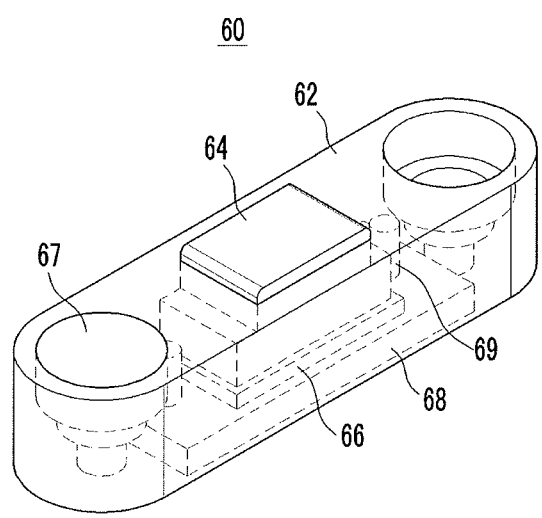
FIG. 2 illustrates a schematic perspective view of a structure of a mask support according to the exemplary embodiment.
Figure 3:
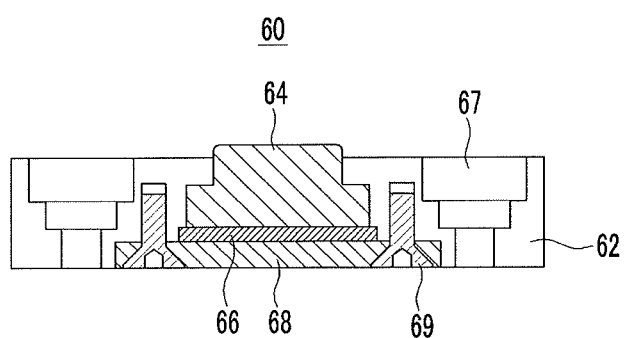
FIG. 3 illustrates a schematic cross-sectional view of the structure of the mask support according to the exemplary embodiment.

FIG. 2 illustrates a schematic perspective view of a structure of the mask support according to the exemplary embodiment. FIG. 3 illustrates a schematic cross-sectional view of the structure of the mask support according to the exemplary embodiment.

Referring to FIGS. 2 and 3, the mask support 60 may include: a body 62 insertedly installed in the mask frame 50; a conductive member 64 insertedly installed in the body 62 to contact and support the mask 40; an elastic member 66 supporting the conductive member 64 and having elasticity; and a fixing member 68 disposed under the elastic member 66.

The body 62 may be formed of a ceramic material that is non-conductive, and the conductive member 64, the elastic member 66, and the fixing member 68, which may be formed of a conductive material, may be insertedly installed in the body 62. The body 62 may be fixed to the mask frame 50 by a fastener 67, e.g., a bolt.

The conductive member 64 may be formed of a metal, e.g., aluminum (Al). In an implementation, the conductive member 64 may be formed of an inorganic material or a polymer having conductivity. The inorganic material having conductivity may include a transparent conductive inorganic material, e.g., indium tin oxide (ITO), transparent conductive oxide (TCO), or indium zinc oxide (IZO).

The elastic member 66 may be formed of a metal. The elastic member 66 may be formed of, e.g., aluminum (Al) or copper (Cu). In an implementation, the elastic member 66 may include a ceramic material and a conductive material coated on a surface of the ceramic material. The elastic member 66 may be shaped like a spring or a sheet.

The fixing member 68 may be disposed under the elastic member 66 to support the conductive member 64 and the elastic member 66. The fixing member 68 may be fixed to the body 62 to help prevent the conductive member 64 and the elastic member 66 from being separated, e.g., from the body 62. The fixing member 68 may be formed of a metal, and may be fixed to the body 62 by a fastener, e.g., a bolt 69.

The conductive member 64, the elastic member 66, and the fixing member 68 constructing the mask support 60 described above may be formed of a conductive material, and charges generated during a film-forming process may be discharged to the electrically grounded susceptor 70 via the mask support 60. Thus, arc discharge may be suppressed by decreasing or eliminating a floating potential of a surface of the mask 40, the upper electrode 20, or a wall of the chamber 80.

Figure 4:
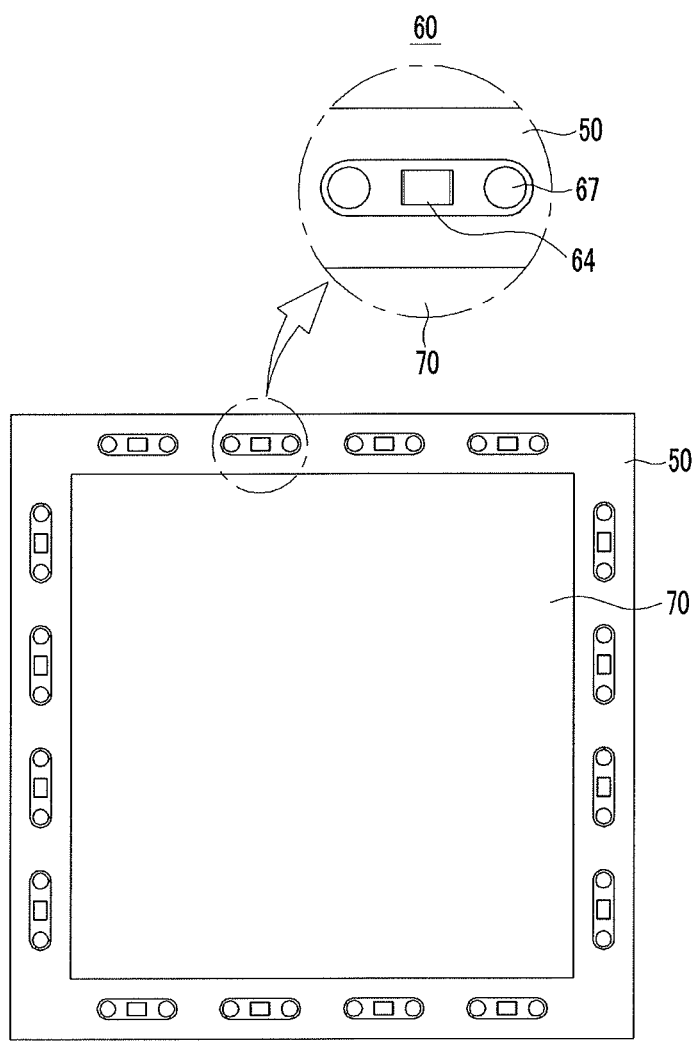
FIG. 4 illustrates a schematic top plan view of a state in which the mask support according to the exemplary embodiment is mounted.

FIG. 4 illustrates a schematic top plan view of a state in which the mask support according to the exemplary embodiment is mounted.

Referring to FIG. 4, the mask frame 50 may be disposed at an edge of the susceptor 70, and the mask support 60 may be insertedly installed in the mask frame 50. The susceptor 70 may have a quadrangular plate shape, and the mask frame 50 may be arranged at the edge of the susceptor 70 in all directions or along all sides. The conductive member 64 of the mask support 60 may upwardly protrude further than a top surface of the susceptor 70, and the susceptor 70 and the mask frame 50 may move up after the substrate S is mounted on the top surface of the susceptor 70. As the mask 40 contacts the mask support 60 (above the susceptor 70), the conductive member 64 may be pressed by the weight of the mask 40. The elastic member 66 may be disposed under the conductive member 64, and each of the conductive members 64 may be pressed to a predetermined height by an elasticity force of the elastic member and the weight of the mask 40.

The mask support 60 may include the conductive member 64, a height of which being controlled by the elastic member 66, and an edge portion of the mask 40 may uniformly contact and be supported by the conductive member 64. In addition, the conductive member 64 of the mask support 60, the elastic member 66, and the fixing member 68 may be formed of a conductive material, and the charges generated in the mask 40 during the film-forming process may be discharged to the outside, thereby decreasing or eliminating the floating potential to help suppress the arc discharge.

By way of summation and review, the mask inside the PECVD equipment may be formed of a metal material such as stainless steel or Invar, and a rest button for supporting such a metal mask may be made of a ceramic material. Accordingly, while separated from the electrode and grounded parts inside the chamber, the mask may have a predetermined floating potential level as charges generated from plasma are accumulated on a surface of the mask.

As the process proceeds, the continually accumulated charges may look for a place through which they can be discharged, and in this case, adjacent metal parts (an upper electrode, a cathode inside the substrate, a chamber wall) and a current channel having high current density may be locally formed to allow a current to be rapidly drawn out, which is called arc discharge. The arc discharge may have serious thermal and physical impacts on the substrate.

Accordingly, damage to a thin film surface or substrate, damage to equipment (a mask, a diffuser, a susceptor, and a chamber wall), and/or abnormal film formation due to plasma variation may occur. In addition, thin film delamination may occur due to the physical impact associated with the arc discharge, and desired characteristics in a semiconductor or display process may not be implemented as voids are generated in a film, thereby causing issues that make it desirable to suppress such an effect.

In addition, when the mask and the substrate are separated from each other to help prevent the arc discharge, radicals contributing to the film-forming may permeate between the mask and the substrate to make it impossible to perform precise and correct film-formation on desired parts, and faults due to such a shadow effect may occur.

As such, using the PECVD apparatus according to the exemplary embodiment, the arc discharge generated between the mask and the substrate, a stable yield and improved equipment performance can be achieved, along with a longer lifespan for the equipment.

For example, when plasma density is increased to increase a film forming speed by increasing applied power or a frequency of applied power, the floating potential of the mask surface may further increase by the high current density of the plasma, and thus arc discharge may be more easily generated, in which case it may be more effective to decrease the floating potential.

Accordingly, using the PECVD apparatus according to an embodiment, high-speed film formation can be implemented, and effects of the reduced tact time and the improved yield may be anticipated.

The embodiments may provide a PECVD apparatus for performing film-formation on a substrate.

The embodiments may provide a mask support for suppressing arc discharge due to a floating potential of the mask generated when a mask used in a thin film deposition apparatus is used while being insulated, and a thin film deposition apparatus including the same.

According to an embodiment, in the PECVD apparatus, by eliminating arc discharge generated between the mask and the substrate, a stable yield and improved equipment performance can be achieved along with a longer lifespan for the equipment.

For example, in order to increase a film forming speed, when applied power or a frequency of an applied voltage is increased to increase a plasma density level, a floating potential of a surface of the mask may further increase due to high current density of the plasma such that the arc discharge is more easily generated, in which case it may be more effective to decrease the floating potential.

Thus, using the PECVD apparatus according to an embodiment, high-speed film formation can be implemented, and effects of the reduced tact time and the improved yield may be anticipated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

| 100: plasma enhanced chemical vapor deposition apparatus | 10: power supply unit |
|---|---|
| 20: upper electrode | 30: spray unit |
| 40: mask | 50: mask frame |
| 60: mask support | 62: body |
| 64: conductive member | 66: elastic member |
| 68: fixing member | 70: susceptor |
| 80: chamber | |

What is claimed is:

1. A plasma enhanced chemical vapor deposition (PECVD) apparatus, comprising:
   a chamber;
   an upper electrode in the chamber;
   a spray unit in the upper electrode to spray a gas introduced from outside the chamber toward a substrate inside the chamber;
   a susceptor on which the substrate is mountable;
   a plurality of mask supports in a mask frame at an edge of the susceptor; and
   a power supply unit to supply power to the upper electrode,
   wherein each mask support includes:
   a body insertedly installed in the mask frame;
   a conductive member insertedly installed in the body, the conductive member contacting and supporting the mask;
   an elastic member supporting the conductive member, the elastic member having elasticity; and
   a fixing member under the elastic member to support the conductive member, the fixing member being fixed to the body to prevent the conductive member and the elastic member from being separated from the body.

2. The PECVD apparatus as claimed in claim 1, wherein the plurality of mask supports are spaced apart from one another on the mask frame with interposing intervals therebetween.

3. The PECVD apparatus as claimed in claim 1, wherein the conductive member is formed of a metal material.

4. The PECVD apparatus as claimed in claim 3, wherein the conductive member is formed of aluminum or copper.

5. The PECVD apparatus as claimed in claim 1, wherein the conductive member is formed of an inorganic material or a polymer having conductivity.

6. The PECVD apparatus as claimed in claim 1, wherein the elastic member is formed of a metal material.

7. The PECVD apparatus as claimed in claim 1, wherein the elastic member includes a ceramic material and a conductive material coated on a surface of the ceramic material.

8. The PECVD apparatus as claimed in claim 1, wherein the elastic member is spring shaped.

9. The PECVD apparatus as claimed in claim 1, wherein the elastic member is sheet shaped.

10. The PECVD apparatus as claimed in claim 1, wherein the body is fixed to the mask frame by a bolt.

11. The PECVD apparatus as claimed in claim 1, wherein the body is formed of aluminum or copper.

12. The PECVD apparatus as claimed in claim 1, wherein the mask is formed of a metal material.

13. The PECVD apparatus as claimed in claim 1, wherein the mask includes a ceramic material and a metal material coated on a surface of the ceramic material.

14. The PECVD apparatus as claimed in claim 1, wherein the mask includes a metal material and a ceramic material coated on a surface of the metal material.

15. The PECVD apparatus as claimed in claim 1, wherein the mask includes a metal material and a polymer material coated on a surface of the metal material.

16. The PECVD apparatus as claimed in claim 1, wherein the power supply unit applies a voltage of −10 kV to +10 kV to the upper electrode.

* * * * *